(12) United States Patent
Gulikers et al.

(10) Patent No.: US 6,436,546 B1
(45) Date of Patent: Aug. 20, 2002

(54) METHOD FOR COATING FOIL COMPRISED OF NICKEL OR NICKEL ALLOY

(75) Inventors: Josephus Gertudis Wilhelmus Pierre Gulikers, Apeldoorn (NL); Peter Malobabic; Erwin Hochreiter, both of Klagenfurt (AU); Klaus Goedicke, Dresden; Jörn-Steffen Liebig, Malschendorf, both of (DE)

(73) Assignees: Stork Veco B.V., Eerbeck; Philips Electronics N.V., Eindhoven, both of (NL)

( * ) Notice: Subject to any disclaimer, the term of this patent is extended or adjusted under 35 U.S.C. 154(b) by 0 days.

(21) Appl. No.: 09/607,632

(22) Filed: Jun. 30, 2000

Related U.S. Application Data

(63) Continuation of application No. PCT/NL99/00013, filed on Jan. 11, 1999.

(30) Foreign Application Priority Data

Jan. 12, 1998 (DE) .......................... 198 00 758

(51) Int. Cl.$^7$ .......................... C23C 14/00; B26B 19/04
(52) U.S. Cl. .......................... 428/469; 428/131; 428/213; 30/346.51; 204/192.12; 204/192.15; 204/192.2; 205/238; 205/271
(58) Field of Search .......................... 427/523, 529, 427/528, 631, 539, 576; 428/615, 621, 632, 469, 457, 688, 131, 213; 30/34.2, 43, 34.1, 346.61, 41.6, 346.51, 346.53; 204/192.1, 192.12, 192.15, 192.22, 192.38; 205/238, 231

(56) References Cited

U.S. PATENT DOCUMENTS

| | | | | |
|---|---|---|---|---|
| 1,888,159 A | * | 8/1932 | Campbell | .......................... 30/70 |
| 3,754,329 A | * | 8/1973 | Lane | .......................... 30/346.53 |
| 4,022,947 A | * | 5/1977 | Grubb et al. | .......................... 428/432 |
| 5,543,183 A |   | 8/1996 | Streckert et al. | |

FOREIGN PATENT DOCUMENTS

DE   44 33 863 A   3/1996

OTHER PUBLICATIONS

Fan, J.C.C.: "Selective–Black Absorbers Using Sputtered Cement Films" International Conference on Metallurgical Coatings. San Francisco, CA, USA. Apr. 3–7, 1978. vol. 54, No. 2, pp. 139–148.

* cited by examiner

*Primary Examiner*—Deborah Jones
*Assistant Examiner*—Stephen Stein
(74) *Attorney, Agent, or Firm*—Hoffmann & Baron, LLP

(57) ABSTRACT

The invention discloses a method for coating foil comprised of nickel or a nickel alloy by sputtering a layer comprised of a metal compound on the foil in a vacuum. The foil is treated in an argon plasma with a pressure of $10^{3\cdot13}$ to $10^{-2}$ millibar, for a variable time with a variable rate, and with energy of the plasma ions. A chromium oxide layer or a layer containing chromium oxide is successively sputtered by means of a reactive magnetron atomizing of at least one target comprised of chromium or an alloy containing chromium. The layer is sputtered with at least one atomization source in an argon-oxygen mixture with a pressure of $10^{-3}$ to $10^{-2}$ millibar. The operating point is constantly maintained in given boundaries and the foil is bonded in a defined thermal contact with a thermal buffer when the foil is being coated. The foil is coated until a given interference color pertaining to an interference of a first or second order is reached on the foil.

9 Claims, 1 Drawing Sheet

– 1 –

METHOD FOR COATING FOIL COMPRISED OF NICKEL OR NICKEL ALLOY

This application is a continuation International Application No. PCT/NL99/00013, filed on Jan. 11, 1999, and which designated the U.S.

FIELD OF THE INVENTION

The invention relates to a process for coating foil comprised of nickel or a nickel alloy and to a coated foil comprised of nickel or a nickel alloy. Coated foils of this type are preferably laterally textured and are used in particular as shaving foils for electric razors.

BACKGROUND OF RELATED TECHNOLOGY

Shaving foils of this type and other products based on nickel foils are generally produced by electrodeposition. Various process variants make it possible to produce both lateral texturing with apertures and projecting parts which form a shaving edge.

Recently, for various reasons, it has been attempted to enable these foils, which are exchangeable, to be recognized visually and to be marked in such a way that there is no risk of confusion, since their application areas differ.

It is known for a metal layer which is from 2.5 to 3 $\mu$m thick to be applied to a nickel foil. Then, this layer is converted into an oxide or hydroxide by anodization or in a plasma (JP 610 648 72-A). This has the drawback that the process is relatively complicated and the bonding strength of the layer is low. Only a few colours of layers can be produced, and the cutting properties are impaired by a layer of this type in the thickness indicated.

It is also known for coloured layers to be produced on cutting tools and razor blades by dipping and electrodeposition treatment of steel materials in chromic acid and sulphuric acid (GB 1,407,407; U.S. Pat. No. 5,528,833; DE 21 26 129 A1; DE 22 30 157; AT 304,996). A drawback is that the deposition of such layers requires ferritic and austenitic steels and treatment temperatures of approximately 300 to 700° C., and consequently these processes cannot be transferred to thin nickel foils.

It is also known for a sublayer of electrodeposited copper and a further metallic layer to be applied to razor blades in order to visually indicate wear and therefore the end of the service life of razor blades (DE 35 33 238). However, it is not possible in this way to produce different layer colours, and layers of this nature also fail to satisfy all the other requirements referred to above, apart from the indication of the level of wear.

Furthermore, it is known for visible marks or organic oxidation indicators of variable colour to be applied to razor blades in order to indicate the wear and therefore the end of the service life of razor blades (U.S. Pat. Nos. 3,879,844; 5,603,161). However, it is not possible in this way to produce a plurality of coatings which can be readily distinguished despite their range of colours, or to satisfy the other requirements which are imposed on such layers as described above.

Furthermore, it is known for various coatings to be applied to cutting tools, in particular to razor foils or shaving foils, so that the cutting properties and the service life are increased. These films have a thickness of from 0.1 to 1 $\mu$m, consist of nitrides or carbides of the metals Ti, W or Cr, and are deposited by sputter ion plating or ion plating. For this purpose, a DC glow discharge at 300° C. is provided (GB 2,123,039 A). These compounds may also be coloured, e.g. by golden titanium nitride. However, the abovementioned processes and coating materials cannot be used for the coating of electrodeposited nickel foils, since the electrodeposition production process and a low content of additive materials, e.g. sulphur, mean that the nickel foils may only be heated to at most 100° C. while the coating is being applied. Otherwise, the foils become brittle, leading to them becoming unusable. Another drawback is the small number and low brilliance of the coloured films which can be produced.

It is also known for films to be applied by physical vapour deposition from nitrides or carbides of the fourth and sixth subgroups of the Periodic System of the Elements, leading to hard, coloured coatings with a thickness of from 0.1 to 1 $\mu$m. These films are, for example, gold-coloured and have the same deficiencies when used for coating nickel shaving foils (DE 34 31 330 A1).

To avoid the drawbacks of the known processes, it is known to apply a high-function film with a high hardness and an adjustable colour to cutting tools, e.g. razors, which are produced by reactive vapour deposition in vacuo at a pressure of $10^{-5}$ to $10^{-4}$ mbar. In the process, metal oxynitrides, especially of the metals titanium or zirconium, are deposited. The metal vapour is generated in a high-vacuum evaporator or by means of ion sources. A film thickness mentioned is 0.3 $\mu$m. This relates to the natural colour of the films formed, but the possibility of generating interference colours is also pointed out (U.S. Pat. No. 5,458,928). However, films which are applied in this way, in particular those with a thickness of around 0.3 $\mu$m, reduce the sharpness of the cutting edges. Furthermore, it is very difficult to use the known processes to obtain a predetermined thickness and a high level of uniformity of the coating. Consequently, a high proportion of nickel foils of differing colour is produced, or else it is necessary to restrict oneself to the use of the body colour of such films. Furthermore, it has been found that the amount of heat introduced during the coating operation, owing to the high enthalpy of formation of the proposed zirconium and titanium compounds, is too high for coating thin nickel foils. Foils with a total thickness of 40 to 55 $\mu$m, as are frequently used, therefore cannot be coated by these processes without becoming brittle.

Overall, it can be concluded that the known processes for producing shaving foils do not provide an optimum solution. The principal requirements of such shaving foils, such as visual marking so that there can be no confusion, differentiated use for different skin types or body parts, decorative and aesthetically pleasing design, prevention of nickel allergies on contact with the skin and a long service life are not fulfilled by any of the known processes.

SUMMARY OF THE INVENTION

The invention is based on the object of providing a process for coating foil comprised of nickel or a nickel alloy, and of providing a coated foil comprised of nickel or a nickel alloy, preferably a shaving foil for electric razors, which has a wear-resistant layer which can be produced in any desired colour and has a good adhesive strength and a very low thickness. There is also the special requirement that the colour tolerances are to be very low and the colour uniformity is to be very high. The process is to be highly productive and economical, i.e. capable of automation. A significant part of the object consists in enabling the coating to take place without imposing excessive thermal loads on the foils, even if the thickness of the foils is only 40 μm or less. A further object of the invention is to provide foils with an indicator of the service life under abrasive load, in particular when used for electric razors, which are distinguished by the fact that this indicator can be adjusted to a predetermined range of values.

According to the invention, the object is achieved using the process according to claim 1. Claims 2 to 7 describe expedient embodiments of the process. A foil which has been coated according to the invention is described in claim 8.

BRIEF DESCRIPTION OF THE DRAWINGS

The invention is explained in more detail below with reference to an exemplary embodiment. In the associated drawings.

DESCRIPTION OF THE PREFERRED EMBODIMENTS

Figure 1:
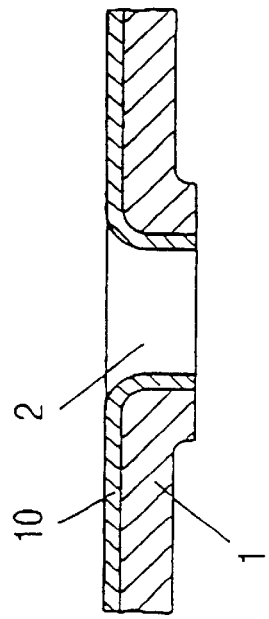
FIG. 1 shows part of a coated foil made from nickel.
Figure 2:
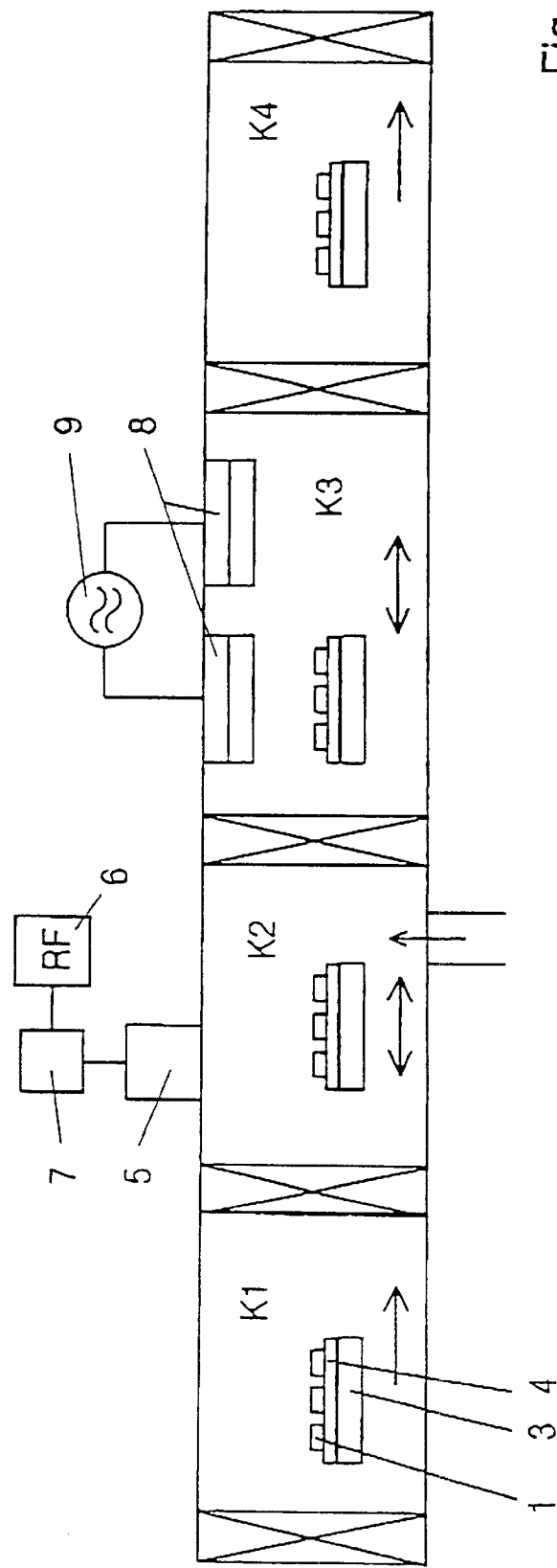
FIG. 2 shows an outline view of a device for carrying out the coating process.

It has been found that the process according to the invention, due to the physico-chemical properties of the oxide of chromium or chromium alloys, results in an extremely low thermal load, in relative terms, during coating of the foils comprised of nickel or a nickel alloy, which are preferably produced by electrodeposition (referred to below as foils). For example, comparisons with titanium oxide show that the specific thermal load on a foil of this type, based on the same film thickness, is higher by a factor of 4 to 6, and such a foil exhibits the abovementioned problem of the nickel foil becoming brittle. By contrast, a foil which has been coated using the process according to the invention can be bent through 180° without breaking; it remains highly ductile. A further result is that the optical characteristics, in particular the refractive index and the absorption coefficient, are suitable for producing interference coatings which have a coloured effect and a high brilliance on foils. The colour locus in accordance with DIN 5033 Part 3, Deutscher Normenausschuss [German Standards Committee], January 1980 edition, and its designation in the CIELAB system can be determined using known calculation methods (cf. in this connection, by way of example, G. Kienel, Vakuumbeschichtung [Vacuum coating], VDI-Verlag, Volume 3, pp. 120 ff. and Volume 4, pp. 97 ff.). Consequently, conversely it is also possible to use a chromaticity diagram to determine the film thickness required using the process according to the invention to achieve the desired colour and to adjust this thickness using means which are known in the vacuum-coating art. The colour tolerance required in practice corresponds to the requirement for a layer thickness tolerance of (±1 to ±5%), depending on the particular application, i.e. to tolerances which can be achieved using the sputtering technique. For example, if a sputtering device with elongate magnetron sputtering sources and a linear movement of foils relative to these magnetron sputtering sources is used to carry out the process, these tolerances can be achieved with a high output even on large-area foils, and consequently the interference colour can be kept constant within narrow limits.

To accurately achieve the required colour, a constant operating point when the process according to the invention is being carried out is also essential. The way in which the operating point is kept constant is described as an advantageous embodiment of the process in claims 6 and 7. A highly constant operating point is then achieved. If the operating point is constant, the stoichiometry of the oxidic chromium compound and therefore the optical characteristics can be set in such a manner that they can be reproduced with a very high level of accuracy.

A further operating principle which has surprisingly been discovered is the specific, highly correlated relationship between the treatment of a foil which is to be coated and has been produced by electrodeposition in a plasma and the resistance to abrasion of the said coloured interference coatings of chromium oxide or oxides of a chromium compound. It has been established that, at the argon pressure of $10^{-2}$ to $10^{-3}$ mbar which is employed according to the invention, in a process parameter range with an ion energy of from 300 to 800 eV and an ion rate which corresponds to an ionic current density of 1 to 4 $mA/cm^2$, the abrasion resistance of the coloured films can be set accurately. As the duration of treatment in the plasma increases, the resistance to abrasion increases, beginning from low levels, initially in linear fashion, then passes through a broad optimum, and then falls again if the duration of treatment is extended still further. The latter effect clearly occurs as a result of diffusion-induced degradation phenomena caused by small amounts of sulphur which are inevitably to be found in foils produced by electrodeposition. In the process according to the invention, these discoveries are used to establish a sufficiently great resistance to abrasion in the said coloured films.

However, it is also particularly advantageous for the resistance to abrasion to be established in such a defined way that the desired service life of the foil, for example when used as a shaving foil of an electric razor, corresponds to the beginning of wear to the coloured layer. The associated change in colour or colour brightness signals the end of the service life.

Expediently, the calibration measurement required to determine the values for the treatment period at a predetermined ion rate and ion energy is performed experimentally using a series of tests. By way of example, the "Taber Abraser 5130 with Pico Glossmaster 500" produced by Erichsen, which generates a rolling and frictional load on the films using a frictional body of standardized hardness and determines the loss of gloss of the layer, is suitable as a calibratable method for testing the resistance of the coloured films to abrasion.

The foils can be coated on one or both sides using the process according to the invention. It is also possible, using known means, to coat only one or a number of areas of the foil.

An expedient embodiment of the process also consists in the foils being connected magnetically to a heat buffer while they are being treated in the plasma and while they are being coated. As a result, despite the low heat capacity of the thin foil and a thermal load which it is impossible to lower during the plasma treatment and the coating of the foil, it can be ensured that the temperature of the foil does not rise by more than 10 to 50K, depending on the colour, i.e. the thickness of the oxide film.

The process according to the invention in each of its embodiments prevents a foil from becoming brittle during coating. A further advantage is that the process can be used to produce extremely thin oxide coatings on foils which are preferably produced by electrodeposition, with an adjustable wear resistance and interference colour while achieving good cutting properties, unlike with coloured layers which are produced using known processes and typically have greater layer thicknesses. The films exhibit a high brilliance of the colours and do not cause any allergies when they come into contact with the skin.

According to the invention, shaving foils for electric razors are produced. Such a foil 1, which is comprised of nickel and is produced by electrodeposition, has a thickness of 50 µm and a pattern of apertures 2 for the facial hairs. The foils 1 are marked according to type, are assessed in terms of their aesthetic appearance and design and marked with respect to their mean service life.

The process is carried out in a known multichamber sputtering unit through which the foils 1 to be coated pass in a linear fashion. For this purpose, the foils 1 are laid onto carrier plates 3 comprising 10 mm thick aluminium panels having a magnetically hard polymer sheet 4 adhered thereto. The plasma treatment and the coating take place in assemblies made from individual foils 1, each forming an area of 80 cm×50 cm. The magnetic attraction of the polymer sheet 4 ensures defined, intensive thermal contact between the foils 1 and the carrier plates 3, which act as a heat buffer. In the first vacuum chamber K1, the carrier plates 3, together with the foils 1 sticking to them, are transferred into the vacuum.

In the second vacuum chamber K2, a gas inlet is used to establish an argon pressure of $3 \cdot 10^{-3}$ mbar. A homogenous flow of ions with a mean current density of 1 mA/cm² at a mean ion energy of 500 V is generated by means of an ion source 5, which is capacitively coupled to a radio-frequency energy source 6 via an adapter network 7. To carry out the plasma treatment, the carrier plate 3 with the foils 1 adhering to it is moved in an oscillating manner 10 times through the flow of ions which is generated by the ion source at a speed of 0.2 m/min.

The coating by reactive magnetron sputtering of two chromium plates which are each the target of a magnetron sputtering source 8 takes place in the third chamber K3. For this purpose, both argon and oxygen are admitted by means of a gas inlet system. A sinewave generator 9 feeds a power of 10 kW to the jointly operating magnetron sputtering sources 8, in such a manner that the targets are alternately connected as cathode and anode of a magnetron gas discharge, with a frequency of 50 kHz. This type of pulsed sputtering, which is known as the dual magnetron system, ensures that the coating process carried out in the argon-oxygen mixture at a pressure of $2 \cdot 10^{-3}$ mbar has a long-term stability. The oxygen content is controlled in such a way that the intensity of a characteristic emission line of the plasma is exactly 10% of the intensity during sputtering without oxygen, i.e. in pure argon.

The carrier plate 3 together with the foils 1 is also moved periodically in a straight line at a fixed speed through the flow of condensing particles during the coating with chromium in the chamber K3. At a speed of the foil 1 of 0.12 m/min, a film 10 with a thickness of 49 nm is formed, while at a speed of 0.28 m/min a film with a thickness of 21 nm is formed.

The stoichiometric chromium oxide films formed, with a thickness in the range referred to above, on the foils 1 are distinguished by a high resistance to abrasion and a high colour brilliance. The interference of the transparent thin films 10 on nickel appears in brilliant blue or yellow. Known measures used for designing the gas inlet and the sputtering sources produce a homogenous film thickness and therefore a homogenous colour, so that all the foils 1 in the assembly have the same properties.

In chamber K4 of the sputtering unit, the foils 1 which have been coated with the film 10 of chromium are removed from the vacuum.

The parameters which have been set for the pretreatment in the plasma are selected in such a way that the mean duration of use provided by the cutting properties of the shaving foil 1 is approximately equal to the level of wear which is caused by abrasion to the coloured film 10 and corresponds to a visible change in colour.

What is claimed is:

1. Process for coating foil comprised of nickel or a nickel alloy, by sputtering a film of a metal compound onto the foil in a vacuum in the area of at least one side of the foil, wherein the foil is treated in an argon plasma at a pressure of $10^{-3}$ to $10^{-2}$ mbar, for an adjustable time and with an adjustable rate and energy of the ions of the plasma, a chromium oxide film is sputtered on by reactive magnetron sputtering of at least one target made from chromium or a chromium-containing alloy using at least one sputtering source in an argon-oxygen mixture at a pressure of $10^{-3}$ to $10^{-2}$ mbar, the operating point being kept constant within defined limits, the foil is connected in defined thermal contact to a heat buffer during the coating, and the coating of the foil continues until a predetermined interference colour with an interference of the first or second order is reached.

2. Process according to claim 1, wherein medium-frequency-pulsed energy is fed to at least one sputtering source in order to effect the reactive magnetron sputtering.

3. Process according to claim 1, wherein the foil is moved relative to the at least one sputtering source during the coating, and in that on at least three occasions during the coating the foil is situated in the region of the particles which are sputtered using a sputtering source.

4. Process according to claim 3, wherein the foil is moved linearly and periodically relative to the at least one sputtering source.

5. Process according to claim 1, wherein the foil is connected to the heat buffer using magnetic means while the process is being carried out.

6. Process according to claim 1, wherein the operating point of a reactive sputtering process carried out using a sputtering source is kept constant by measuring the optical emission of the plasma in the vicinity of this sputtering source.

7. Process according to claim 1, wherein the operating point of a reactive sputtering process carried out using a sputtering source is kept constant by measuring an electrical characteristic of the magnetron discharge from this sputtering source.

8. Process according to claim 1, wherein the foil is produced by electrodeposition.

9. Razor foil having apertures comprising electrodeposited nickel or a nickel alloy coated on the area of at least one side with a vacuum sputtered film of a metal compound wherein the film consists of an oxide of chromium or an oxide of chromium-containing alloy, having a thickness in the range of 20–300 nm.

* * * * *